(12) United States Patent
Misawa

(10) Patent No.: US 9,781,315 B2
(45) Date of Patent: *Oct. 3, 2017

(54) DISPLAY DEVICE WITH DEFORMABLE COVER MEMBER

(71) Applicant: FUJIFILM Corporation, Tokyo (JP)

(72) Inventor: Atsushi Misawa, Asaka (JP)

(73) Assignee: FUJIFILM Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/266,526

(22) Filed: Sep. 15, 2016

(65) Prior Publication Data

US 2017/0006196 A1 Jan. 5, 2017

Related U.S. Application Data

(63) Continuation of application No. 14/830,340, filed on Aug. 19, 2015, now Pat. No. 9,451,134, which is a (Continued)

(30) Foreign Application Priority Data

Dec. 9, 2005 (JP) ................................. 2005-356483

(51) Int. Cl.
H04N 5/225 (2006.01)
H04N 5/232 (2006.01)
(Continued)

(52) U.S. Cl.
CPC ........... *H04N 5/2252* (2013.01); *G03B 17/02* (2013.01); *G03B 17/563* (2013.01); *G06F 3/02* (2013.01);
(Continued)

(58) Field of Classification Search
CPC ............ H04N 5/2252; H04N 5/23216; H04N 5/23241; H04N 5/23293; G06F 3/02
See application file for complete search history.

(56) References Cited

U.S. PATENT DOCUMENTS 4,259,568 A 3/1981 Dynesen
7,057,660 B1 6/2006 Okuda
(Continued)

FOREIGN PATENT DOCUMENTS

JP 4-101536 9/1992
JP 7-225410 A 8/1995
(Continued)

OTHER PUBLICATIONS

Japanese Office Action issued in corresponding JP Application No. 2005-356483, dated Dec. 5, 2011.
(Continued)

*Primary Examiner* — Tuan Ho
(74) *Attorney, Agent, or Firm* — Sughrue Mion, PLLC

(57) ABSTRACT

The present invention provides a display device which has a display unit on a main body, comprising a cover member that can be deformed into a first shape for covering the display unit and a second shape for forming a grip in order to solve the problems in the conventional cameras. The problem is such that the size of the camera becomes large by the size of the grip, which impairs portability of the camera because the conventional camera provides a fixed grip on the camera body on which a display unit with a large screen is mounted. In addition, another conventional camera has a space for accommodating the cover members within the grip, so that the size of the grip becomes accordingly large and thus the camera itself becomes large.

15 Claims, 16 Drawing Sheets

Related U.S. Application Data continuation of application No. 14/326,884, filed on Jul. 9, 2014, now Pat. No. 9,247,113, which is a continuation of application No. 13/310,121, filed on Dec. 2, 2011, now Pat. No. 8,804,023, which is a continuation of application No. 11/636,466, filed on Dec. 11, 2006, now Pat. No. 8,094,229.

(51) Int. Cl.
| | | |
|---|---|---|
| *G03B 17/02* | (2006.01) | |
| *H05K 5/00* | (2006.01) | |
| *H05K 5/03* | (2006.01) | |
| *G03B 17/56* | (2006.01) | |
| *G06F 3/02* | (2006.01) | |

(52) U.S. Cl.
CPC ..... *H04N 5/23216* (2013.01); *H04N 5/23241* (2013.01); *H04N 5/23293* (2013.01); *H05K 5/0017* (2013.01); *H05K 5/03* (2013.01)

(56) References Cited

U.S. PATENT DOCUMENTS

| | | |
|---|---|---|
| 7,184,086 B2 | 2/2007 | Tamura |
| 7,454,239 B2 | 11/2008 | Infanti |
| 7,551,220 B2 | 6/2009 | Morikawa et al. |
| 7,808,550 B2 | 10/2010 | Misawa |
| 2005/0212942 A1 | 9/2005 | Sakai |
| 2013/0222664 A1 | 8/2013 | Takahashi et al. |

FOREIGN PATENT DOCUMENTS

| | | |
|---|---|---|
| JP | 11-298773 A | 10/1999 |
| JP | 2000-162670 A | 6/2000 |
| JP | 2004-184652 A | 7/2004 |

OTHER PUBLICATIONS

Office Action issued from the Japan Patent Office on Aug. 3, 2011 in connection with Japanese patent application No. 2005-356483.

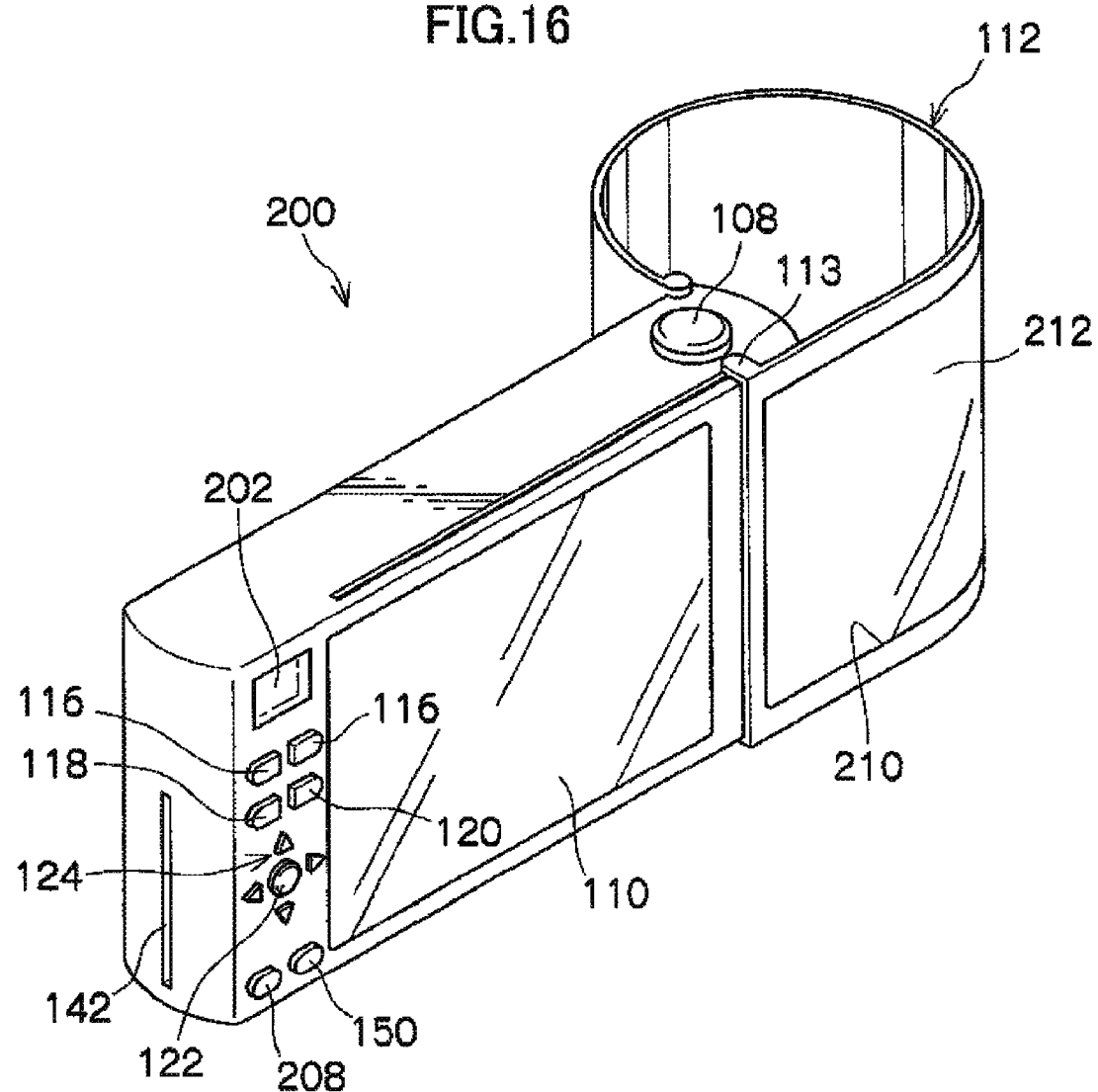

DISPLAY DEVICE WITH DEFORMABLE COVER MEMBER

CROSS REFERENCE TO RELATED APPLICATIONS

This application is a continuation of U.S. application Ser. No. 14/830,340 filed Aug. 19, 2015, which is a continuation of U.S. application Ser. No. 14/326,884 filed Jul. 9, 2014, now U.S. Pat. No. 9,247,113 issued Jan. 26, 2016, which is a continuation of U.S. application Ser. No. 13/310,121 filed Dec. 2, 2011, now U.S. Pat. No. 8,804,023 issued Aug. 12, 2014, which is a continuation of U.S. application Ser. No. 11/636,466 filed Dec. 11, 2006, now U.S. Pat. No. 8,094,229 issued Jan. 10, 2012 which claims priority under 35 USC 119 from Japanese Patent Application No. 2005-356483 filed Dec. 9, 2005. The entire disclosures of the prior applications are considered part of the disclosure of the accompanying continuation application, and are hereby incorporated by reference.

BACKGROUND OF THE INVENTION

Field of the Invention

The present invention relates to a display device, and more particularly, to a display device such as a portable photo player, DVD player, and digital camera that has a display unit on the device body.

Description of the Related Art

As screens of display units become larger for display devices that have a display unit such as a liquid crystal monitor, digital cameras in particular, it has been a trade-off to improve ease of gripping while making the camera body small. That is, to improve ease of gripping of a digital camera that is equipped with a large-screen display unit, the camera body has to be made large by the size of the grip. In addition, for digital cameras, various means have been devised for protecting display screens from flaws and dirt as display screens become larger. For example, Japanese Patent Application Laid-Open No. 11-298773 discloses a digital camera that contains a cover member for protecting the entire area of the display screen.

This digital camera contains a plurality of cover members (i.e., light-shielding plates) for protecting the entire area of the display screen inside the grip of the camera body, and when a user carries the camera, the user slides out the cover members from within the grip toward the display screen one by one to cover the entire display screen. When taking pictures, the user tucks the cover members into the grip in sequence so as to expose the display screen.

SUMMARY OF THE INVENTION

However, since the camera disclosed in Japanese Patent Application Laid-Open No. 11-298773 provides a fixed grip on the camera body on which a display unit with a large screen is mounted, the size of the camera becomes large by the size of the grip, which impairs portability of the camera. In addition, the camera of Japanese Patent Application Laid-Open No. 11-298773 has a space for accommodating the cover members within the grip, so that the size of the grip becomes accordingly large and thus the camera itself becomes large.

The present invention has been made in view of such circumstances, and has an object of providing a display device equipped with a large-screen display unit that can cover the entire area of the display screen while making the device body compact when it is carried, and that can improve ease of gripping when the compact device body is operated.

To attain the above object, the invention according to a first aspect provides a display device that has a display unit on the device body, characterized in that it comprises a cover member that can be deformed into a first shape for covering the display unit and a second shape for forming a grip.

According to the invention set forth in the first aspect, the deformable cover member is provided on the device body, and when the device is carried, the cover member is deformed into the first shape for covering the entire area of the large-screen display unit, and when the device is used, the cover member is deformed into the second shape in which the cover forms a grip. Consequently, the entire area of the display screen can be protected with the cover member on the display device that has a large-screen display unit. Since the grip does not exist when the device is carried, the device body can be made small when it is carried. Furthermore, since the cover member serves as a grip when the device is used, ease of griping of the compact device body when operating it can be improved.

The invention according to a second aspect is the display device according to the first aspect, characterized in that it further comprises a detection device which detects the first and second shapes of the cover member, and a display unit driving device which turns off the display unit when it is detected that the cover member is in the first shape by the detection device and turns on the display unit when it is detected that the cover member is in the second shape.

According to the second aspect, the display unit driving device automatically turns off the display unit when it is detected that the cover member is in the first form by the detection device, and automatically turns on the display unit when it is detected that the cover member is in the second shape by the detection device. This enables the display unit to be automatically switched between ON and OFF states according to the shape of the cover member in response to an action of changing the shape of the cover member.

The invention according to a third aspect is the display device according to the first or second aspect, characterized in that it further comprises a detection device which detects the first and second shapes of the cover member, and a power switch that shuts off the display device when it is detected that the cover member is in the first shape by the detection device and powers up the display device when it is detected that the cover member is in the second shape.

According to the invention set forth in the third aspect, the power switch automatically turns off the display device when it is detected that the cover member is in the first shape by the detection device, and automatically turns on the display device when it is detected that the cover member is in the second shape by the detection device. Consequently, the display device can be automatically turned on and off in response to an action of changing the shape of the cover member.

The invention according to a fourth aspect is the display unit according to the first, second, or third aspect, characterized in that an operation device for the display device is provided on the cover member.

According to the invention set forth in the fourth aspect, since the operation device for the display device is provided on the cover member, the operation device can be manipulated with the user's hand that holds the cover member when the cover member is deformed into the second shape in which it forms a grip. This improves the operability of the operation device.

With the display device according to the present invention, it is possible to protect the entire area of a display screen with a cover member on a display device equipped with a large-screen display unit. In addition, since the grip does not exist when the device is carried, the device body can be made compact when it is carried. Furthermore, the cover member serves as a grip when the device is used, so that ease of gripping of the compact device body is improved.

BRIEF DESCRIPTION OF THE DRAWINGS

FIG. 16 is a rear perspective view of the digital camera shown in FIG. 14 when it is used for taking pictures and reproducing images.

DETAILED DESCRIPTION OF THE PREFERRED EMBODIMENTS

Figure 1:
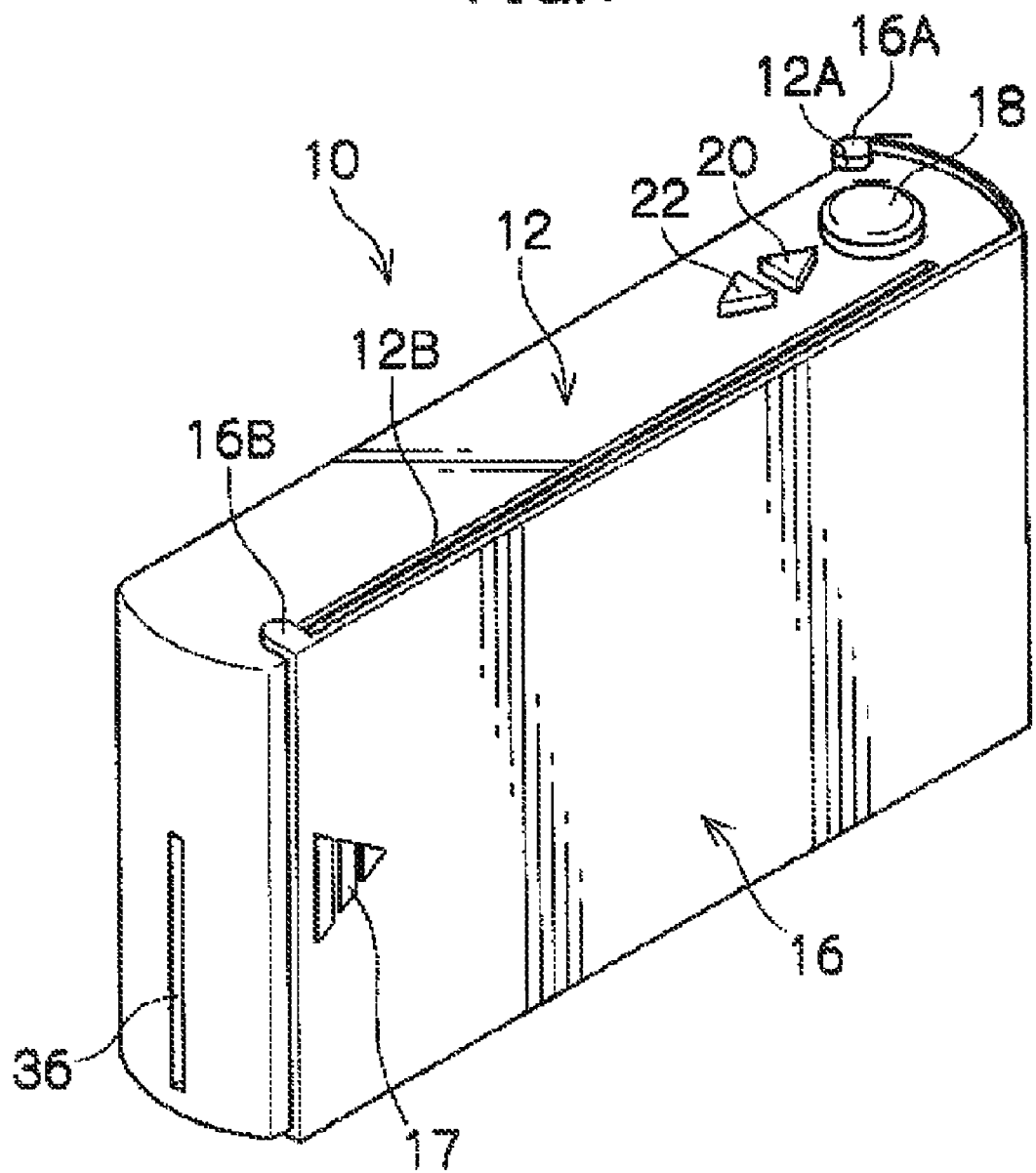
FIG. 1 is a front perspective view of a photo player of an embodiment when it is carried.

Preferred embodiments of the display device according to the present invention will be described with respect to accompanying drawings. FIGS. 1 though 7 show embodiments as a photo player that has a liquid crystal monitor (display unit) and FIGS. 8 through 16 show embodiments as a digital camera that has a liquid crystal monitor. However, the present invention is not limited to photo players and digital cameras: it is applicable to personal digital assistants, DVD players, portable telephones, and gaming machines that have a display unit.

Figure 2:
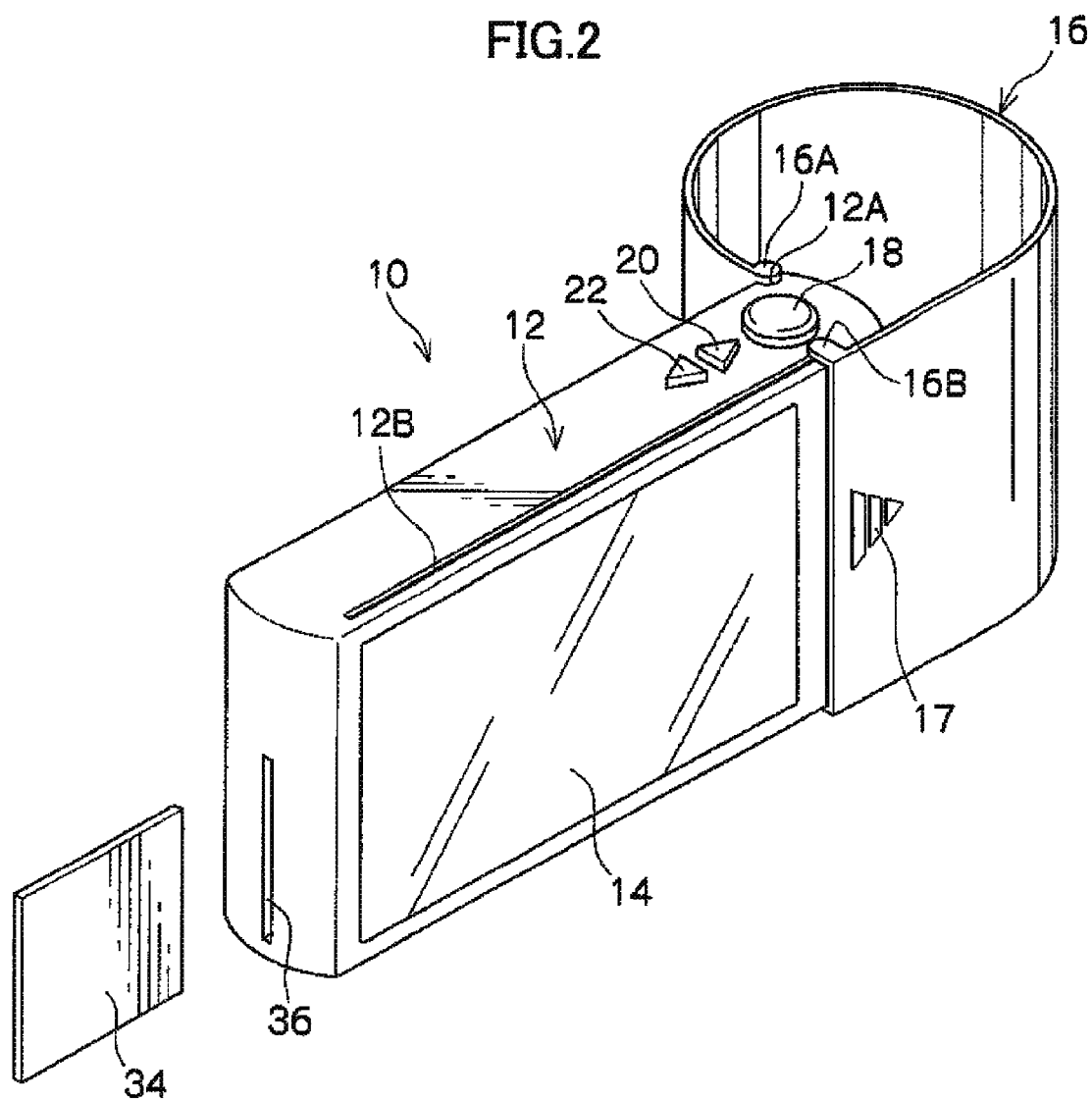
FIG. 2 is a front perspective view of the photo player shown in FIG. 1 when it is used.

FIG. 1 shows a front perspective view of a photo player 10 of an embodiment when it is carried and FIG. 2 is a front perspective view of the photo player 10 when it is used. The body housing (or device body) 12 of the photo player 10 has an outer appearance of a flat approximate rectangular parallelepiped that is thin in the direction of thickness and also has a horizontally long shape with the lateral size of the body housing 12 being larger than the longitudinal size.

On the body housing 12, a liquid crystal monitor (i.e., display unit) 14 having an aspect ratio of 9:16 is provided as shown in FIG. 2. The liquid crystal monitor 14 has a screen size as large as possible that can be used on the body housing 12. The body housing 12 is also equipped with a strip-shaped cover (cover member) 16 that covers the entire screen of the liquid crystal monitor 14 as shown in FIG. 1. The cover 16 is made of a deformable material such as flexible plastic or rubber, and is deformed into a first shape for covering the liquid crystal monitor 14 (see FIG. 1) and a second shape for exposing the liquid crystal monitor 14 and taking a shape of an arc at one side of the body housing 12 so as to form a grip (see FIG. 2).

On the right edge of the strip-shaped cover 16, an approximate circular cylinder 16A is formed, and this approximate circular cylinder fits into a recess 12A that is formed on the right back side of the body housing 12 so that the cover can be removably attached to the body housing 12. Locking portions 16B are formed at the top and bottom of the left end of the cover 16 (the lower locking portion not shown) and the locking portions 16B fit in rails 12B that are formed horizontally on the upper and bottom surface of the body housing 12 (the lower rail not shown). Sliding the locking portions 16B on the cover 16 from the initial position shown in FIG. 1 to the right in this state, the display surface of the liquid crystal monitor 14 becomes exposed. When the locking portions 16B stop in the rails 12B by friction at the end of the rails 12B shown in FIG. 2, the cover 16 is maintained in the second shape.

Reference numeral 17 designates a finger stopper for sliding the cover 16. The cover 16 may also be fixed on the body housing 12, or if the body housing 12 is made of plastic, may be integrally formed with the body housing 12. Further, the cover 16 may be opaque or transparent. If the cover 16 is transparent, the presence of the liquid crystal monitor 14 can be visually seen through the cover 16 in the first shape so that design as a product is improved.

On the upper right surface of the body housing 12, various operations buttons 18, 20, and 22 for manipulating the photo player 10 are positioned side by side. The operation button 18 is for instructing start/stop when reproducing images, the operation button 20 is for instructing frame-by-frame advance, and the operation button 22 is for instructing rewind. The number of operation buttons and what can be operated with them are not limited to ones illustrated here: it is also possible to add buttons for instructing functions like fast-forward, chapter mark addition, or pause.

Figure 3:
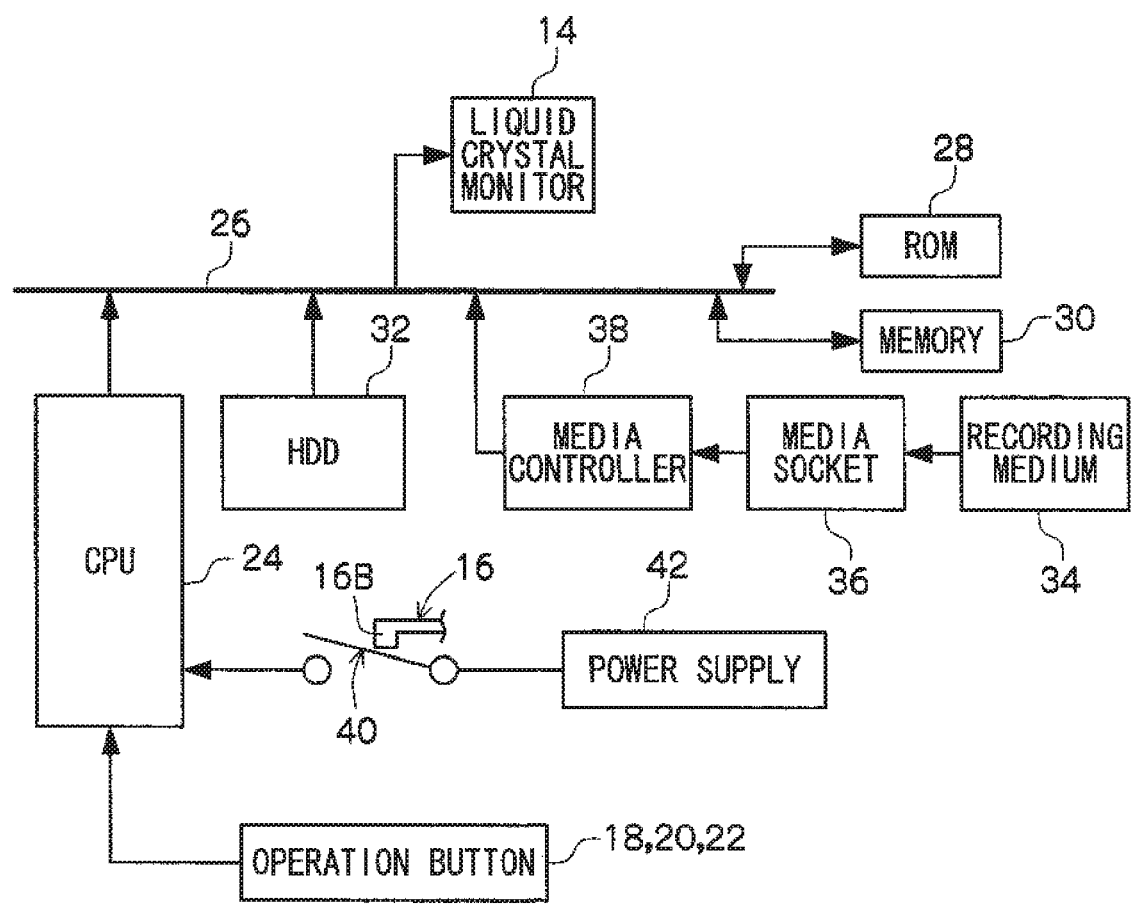
FIG. 3 is a block diagram showing the configuration of the photo player shown in FIG. 1.

The overall operation of the photo player 10 is centrally controlled by a central processing unit (CPU, or a display unit driving device) 24 as shown in FIG. 3. The CPU 24 functions as a control device which controls the player system according to a predetermined program. ROM 28, which is connected to the CPU 24 via a bus 26, stores therein programs to be executed by the CPU 24 and various data necessary for control. Memory 30 is utilized as a work area for operation by the CPU 24. A recording unit (HDD) 32 is temporal storage memory dedicated for image data. The liquid crystal monitor 14 displays images stored in the recording unit (HDD) 32 that are read out by the CPU 24 and images stored in a recording medium 34. The liquid crystal monitor 14 may be a display unit of a different system such as organic EL instead of a liquid crystal display.

The photo player 10 has a media socket 36 on the left side of the body housing 12 as shown in FIG. 2 and the recording medium 34 is inserted into the media socket 36. The recording medium 34 is not limited to a particular format: it may be various media such as semiconductor memory cards represented by Smart Media (a registered trademark), portable small hard disks, magnetic disks, optical disks, magneto-optical disks. A media controller 38 shown in FIG. 3 performs signal conversion required for passing input/output signals appropriate for the recording medium 34 inserted into the media socket 36.

With the photo player 10, when the cover 16 is deformed into the second shape shown in FIG. 2, a leaf switch (a detection device or power switch) 40 shown in FIG. 3 that is positioned at the end of the rail 12B is pushed by the locking portion 16B of the cover 16 to be turned on. This causes a power supply 42 to supply power to the CPU 24, which turns on the liquid crystal monitor 14 so that it is ready to display images. On the other hand, when the cover 16 is deformed into the first shape shown in FIG. 1, the leaf switch 40 in FIG. 3 is released from the locking portion 16B of the cover 16 to be turned off. Consequently, power supply to the photo player 10 is shut off, which in turn switches off the liquid crystal monitor 14. The description here illustrates the leaf switch 40 as a detection device, this is not limitation: any switch that is capable of detecting the second shape of the cover 16 can be used. It is also possible to provide a detection device that detects the first shape of the cover 16. In that case, when the cover 16 is deformed to the first shape shown in FIG. 1, the detection device detects it and shuts off power supply.

The following will describe the usage of the photo player 10 which has the configuration described above.

Figure 4:
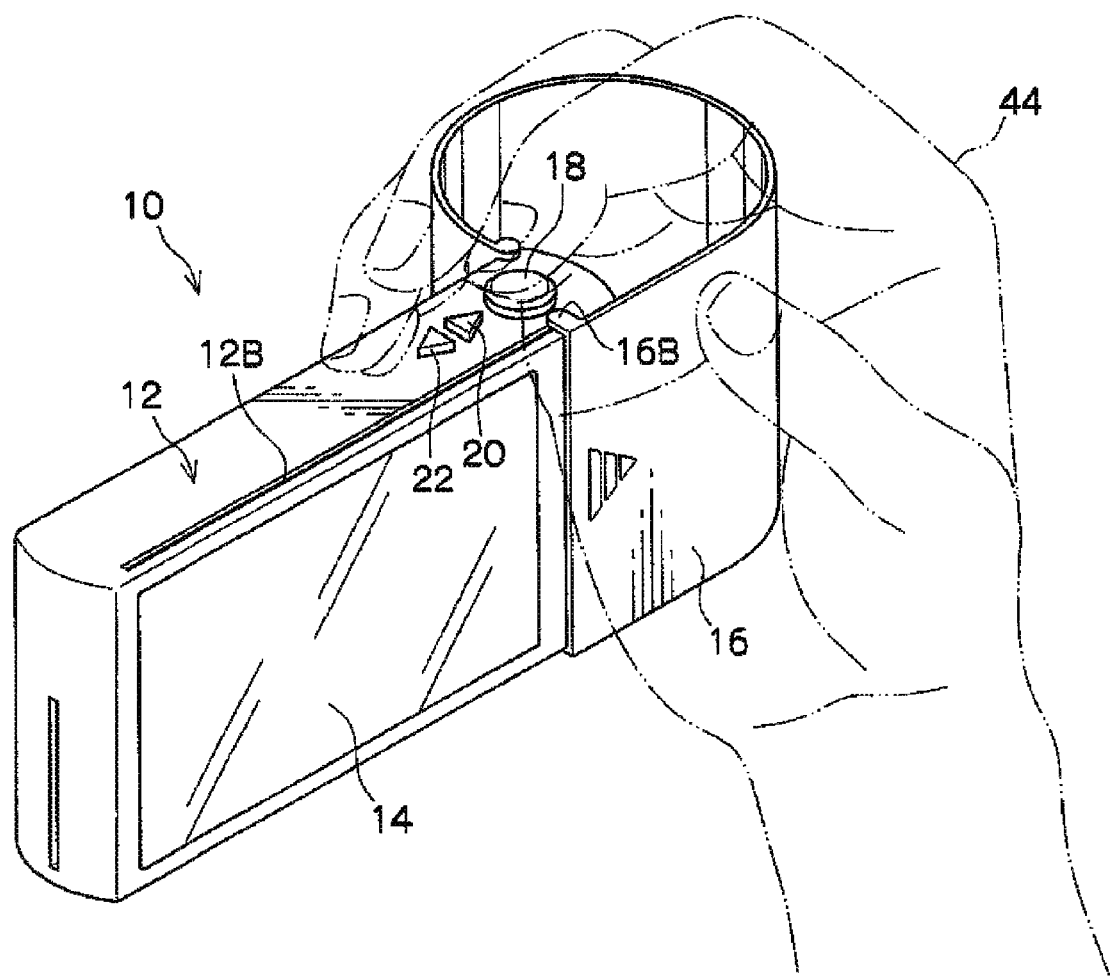
FIG. 4 is a perspective view of the photo player with its cover serving as a grip.

When the user views (reproduces) images on the photo player 10, the user deforms the cover 16 from the first shape shown in FIG. 1 to the second shape shown in FIG. 2. This turns on the leaf switch 40 of FIG. 3 and powers up the photo player 10. Then, the user holds the cover 16, which serves as a grip, with the user's right hand 44 as shown by two-dot chained line in FIG. 4 and operates the operation buttons 18, 20 and 22 with the fingers of the right hand 44 so as to display moving images and/or still images stored in the recording unit (or HDD) 32 and/or recording media 34 on the liquid crystal monitor 14. The user can thus view images on the photo player 10.

When the user carries the photo player 10, the user deforms the cover 16 from the second shape shown in FIG. 2 to the first shape shown in FIG. 1. Consequently, the leaf switch of FIG. 3 is turned off and the photo player 10 is powered down. The user carries the photo player 10 in this state.

Thus, the photo player 10 configured in such a manner provides the deformable cover 16 on the body housing 12 and the user deforms the cover 16 into the first shape that covers the entire area of the liquid crystal monitor 14 when carrying the player 10 and deforms the cover 16 into the second shape for forming a grip when using the player 10, so that the entire area of the liquid crystal monitor 14 can be protected with the cover 16 on the photo player 10 which has the large-screen liquid crystal monitor 14. In addition, as the grip does not exist when the player 10 is carried, it is possible to make the body housing 12 compact when carrying it. When the user views images, the cover 16 serves as a grip, so that ease of gripping of the compact body housing 12 is improved when the user operates the player 10.

In addition, on the photo player 10, the CPU 24 automatically turns on the liquid crystal monitor 14 when it is detected that the cover 16 is in the second shape through turning on of the leaf switch 40, and the CPU 24 automatically turns off the liquid crystal monitor 14 when it is detected that the cover 16 is in the first shape through turning off of the leaf switch 40. This enables automatic switching of the liquid crystal monitor 14 between on and off states according to the shape of the cover 16 in response to an action of changing the shape of the cover 16.

Furthermore, the photo player 10 is automatically powered up when it is detected that the cover 16 is in the second shape thorough turning on of the leaf switch 40, and is automatically powered down when it is detected that the cover 16 is in the first shape through turning off of the leaf switch 40. This enables the photo player 10 to be automatically turned on and off in response to an action of changing the shape of the cover 16.

Figure 5:
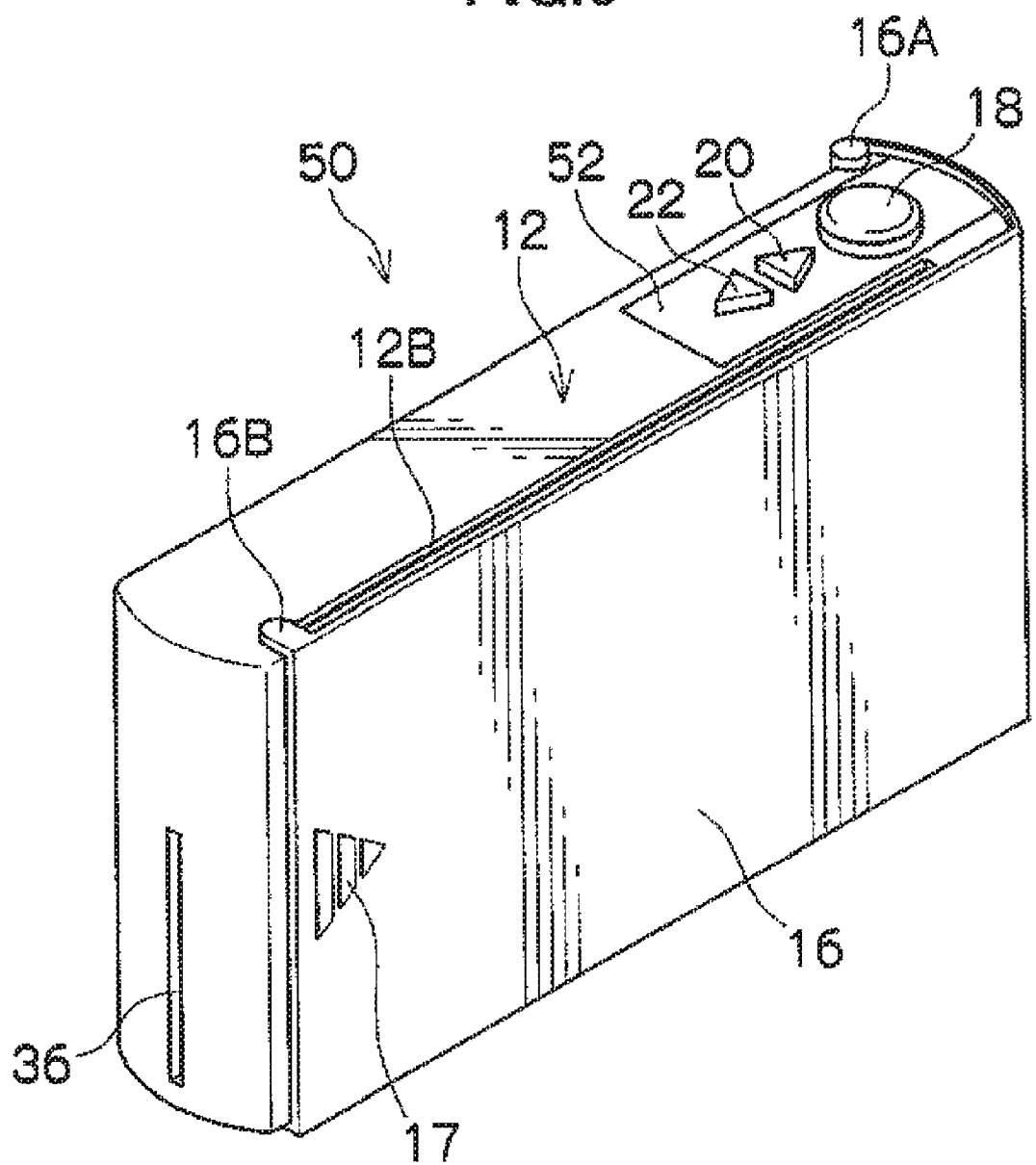
FIG. 5 is a perspective view showing another embodiment of the photo player when it is carried.
Figure 6:
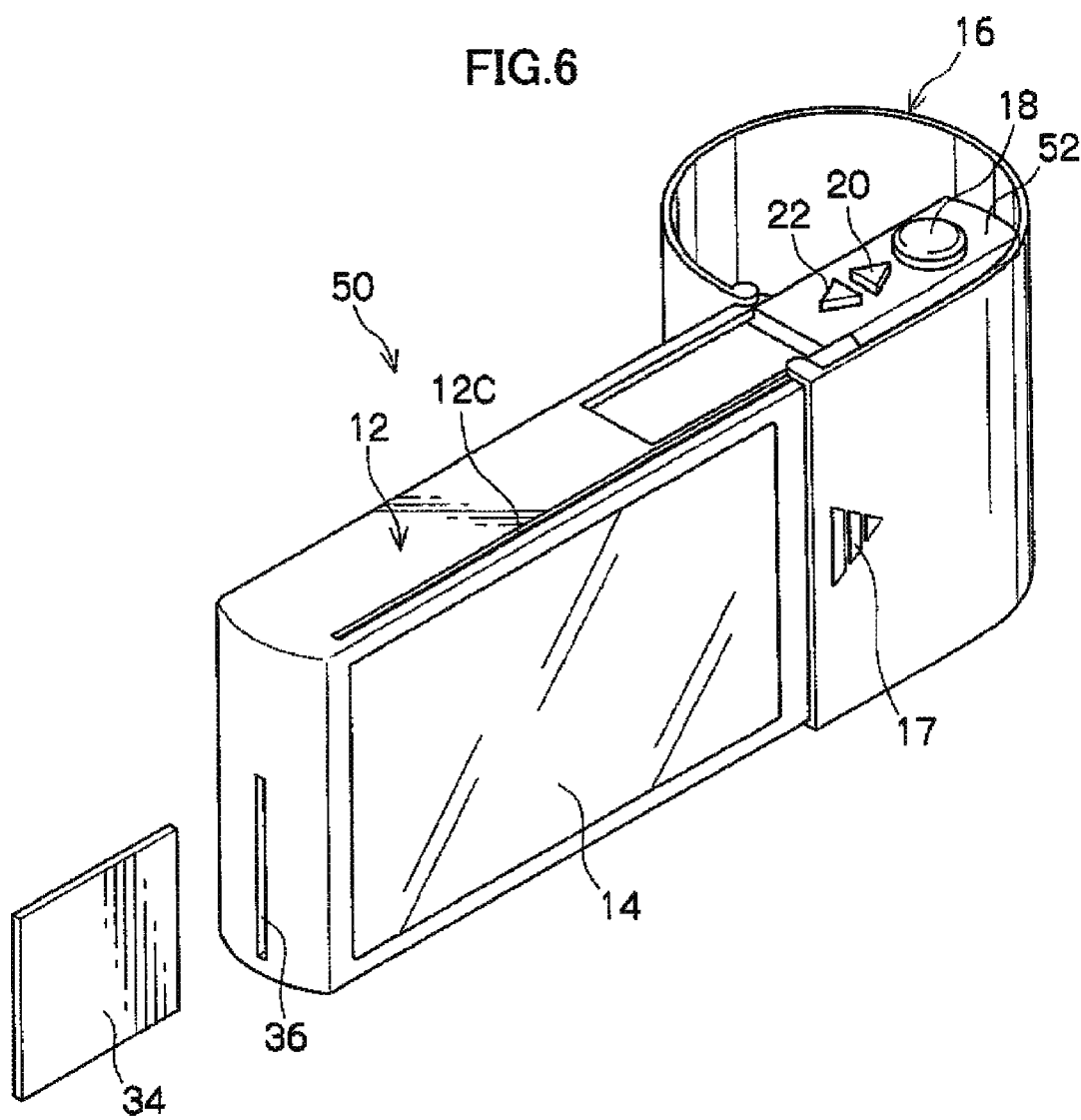
FIG. 6 is a perspective view illustrating the photo player shown in FIG. 5 when it is used.
Figure 7:
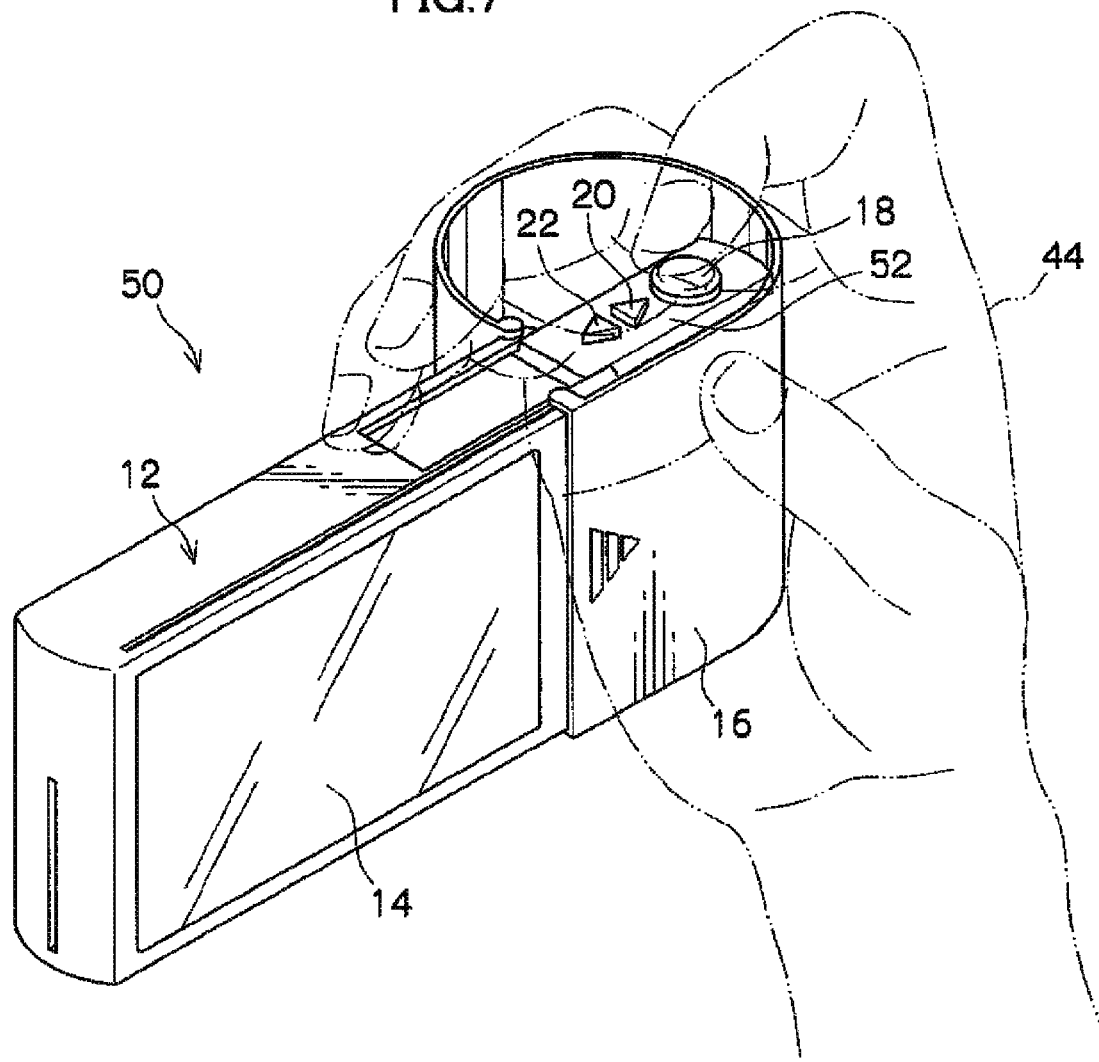
FIG. 7 is a perspective view of the photo player of FIG. 6 with its cover serving as a grip.

FIGS. 5 to 7 illustrate another embodiment of a photo player 50.

The photo player 50 has a button plate 52 on which operation buttons 18, 20 and 22 are positioned such that the button plate 52 can be slid on the upper surface of the body housing 12 between the position for carrying the player 50 shown in FIG. 5 and the position for using it shown in FIGS. 6 and 7. In this case, the operation buttons 18, 20 and 22 are connected to the CPU 24 shown in FIG. 3 via a flexible substrate not shown.

As illustrated in FIGS. 6 and 7, by protruding the button plate 52 when using the player 50 from the side of the body housing 12 toward the cover 16 that serves as a grip, the operation buttons 18, 20 and 22 get closer to the right hand 44 of the user that holds the cover 16, which improves the operability of the operation buttons 18, 20 and 22. For the photo player 50, it is also possible to provide a detection device which detects the position of the button plate 52, that is, the position for carrying shown in FIG. 5 and that for use shown in FIGS. 6 and 7, and turn on/off the power supply to the photo player 10 and/or the liquid crystal monitor 14 according to the positions.

Figure 8:
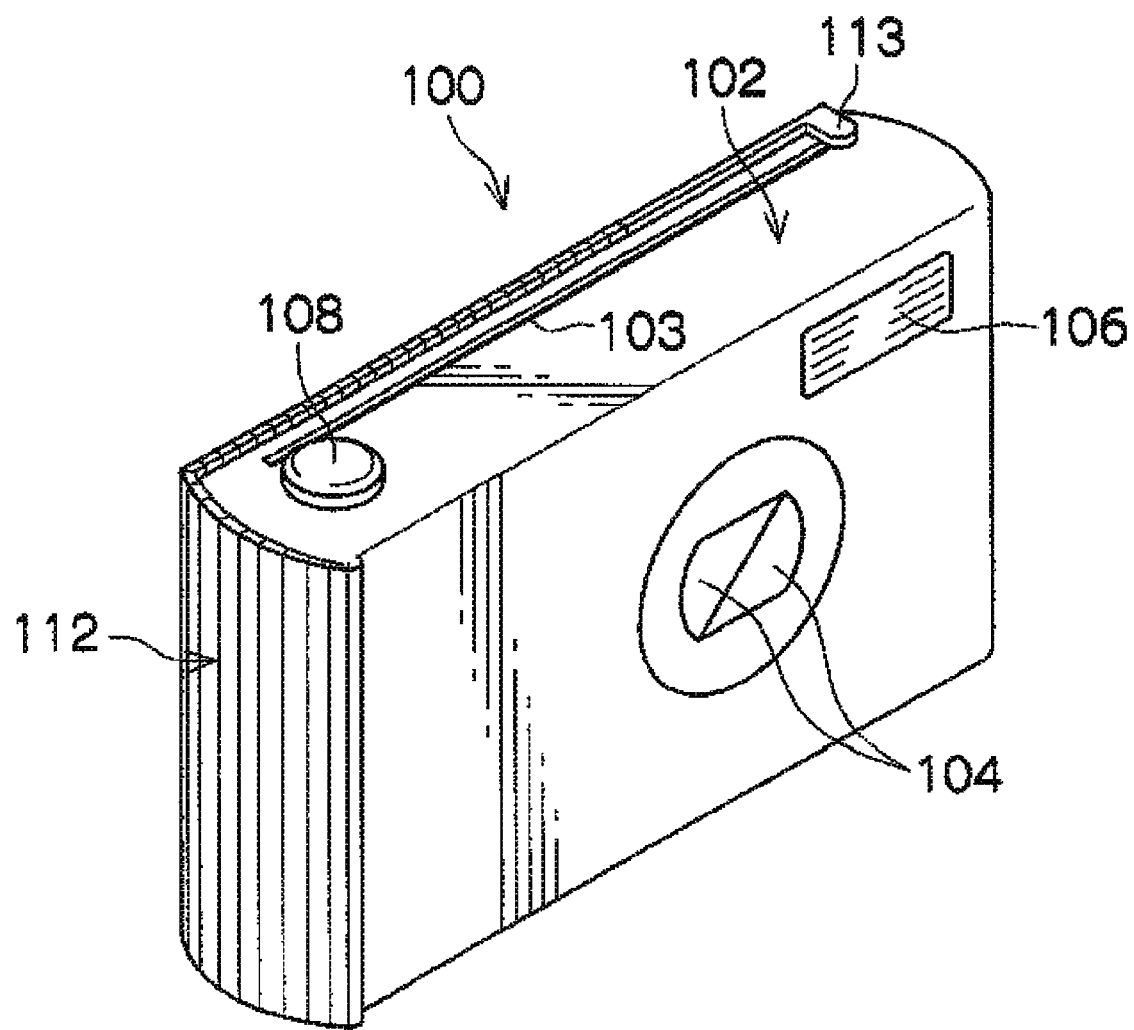
FIG. 8 is a front perspective view of a digital camera of an embodiment when it is carried.
Figure 9:
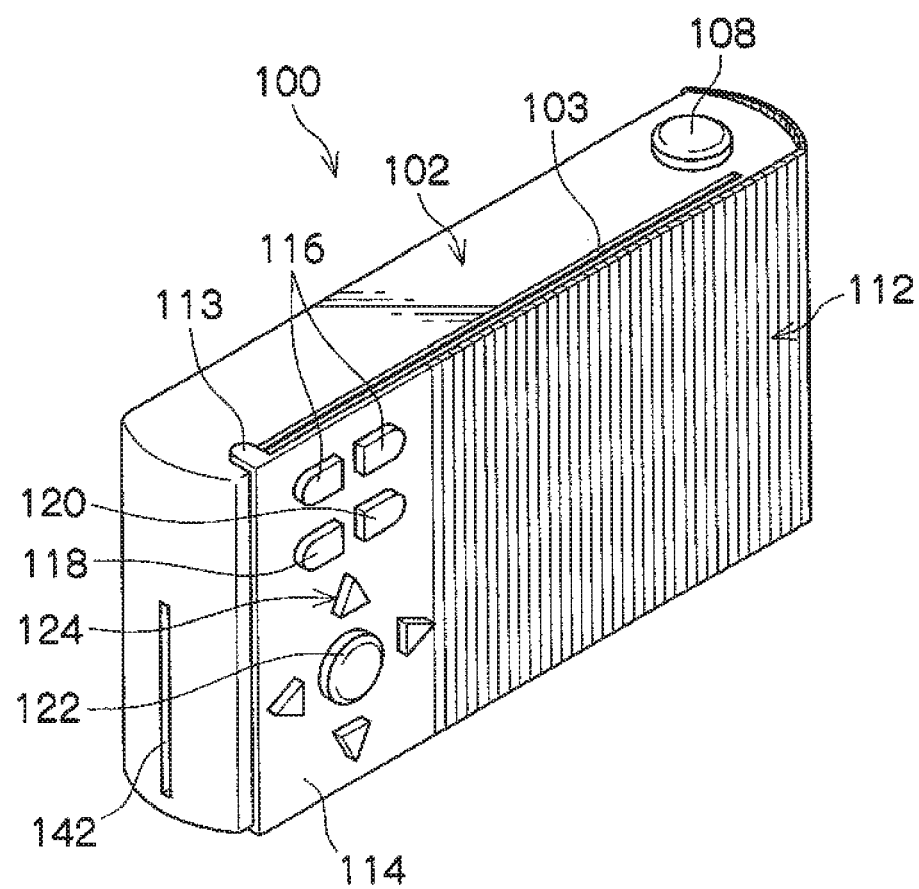
FIG. 9 is a rear perspective view of the digital camera shown in FIG. 8 when it is carried.
Figure 10:
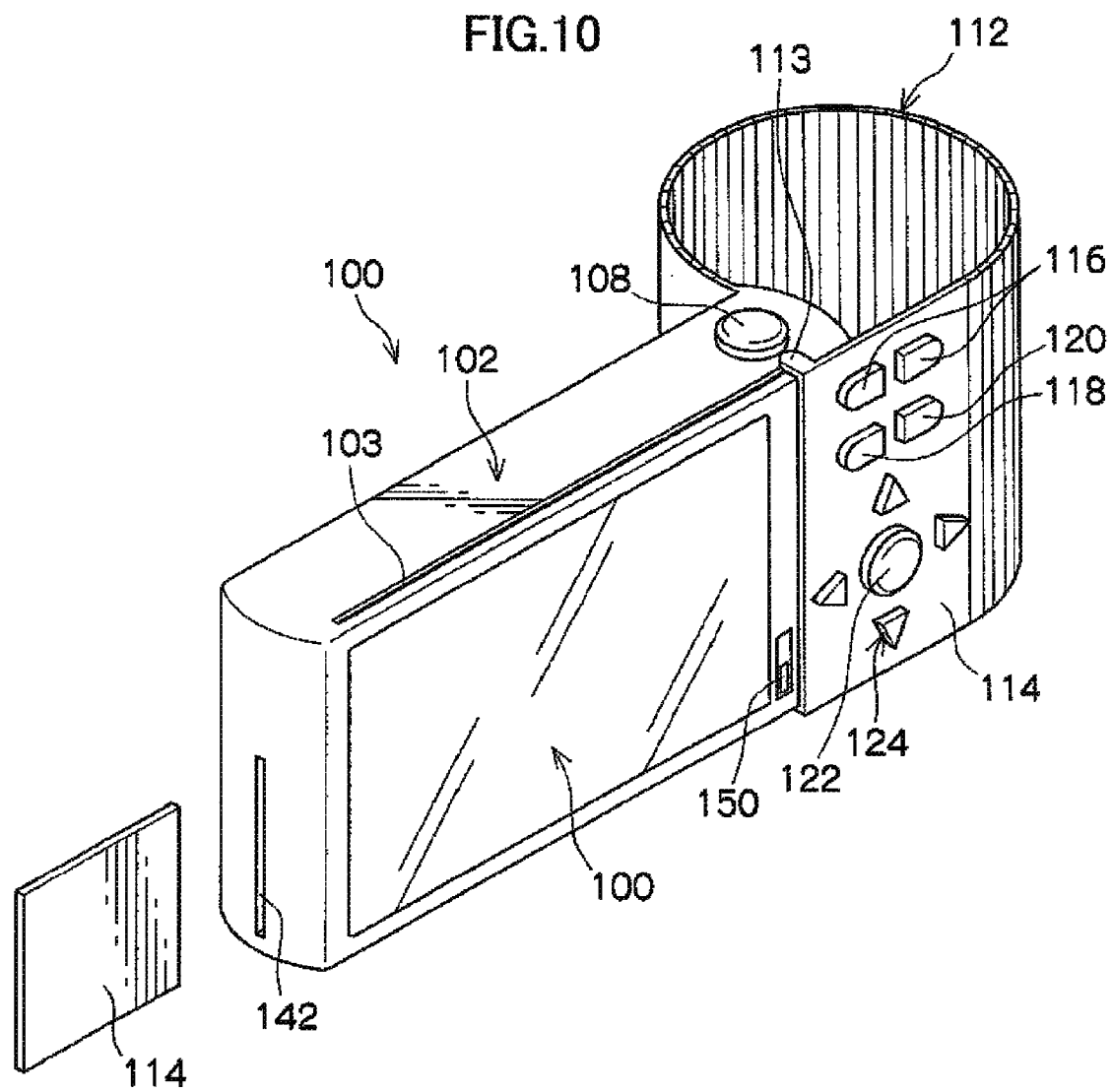
FIG. 10 is a rear perspective view of the digital camera shown in FIG. 8 when it is used.

FIG. 8 is a front perspective view of a digital camera 100 of an embodiment when it is carried and FIG. 9 is a rear perspective view of the digital camera 100 when it is carried. FIG. 10 is a rear perspective view of the digital camera 100 when it is used.

The body housing (device body) 102 of the digital camera 100 has an outer appearance of a flat approximate rectangular parallelepiped that is thin in the direction of width and has a horizontally long shape with the size of the body housing 102 in width direction larger than the size in height direction.

Figure 11:
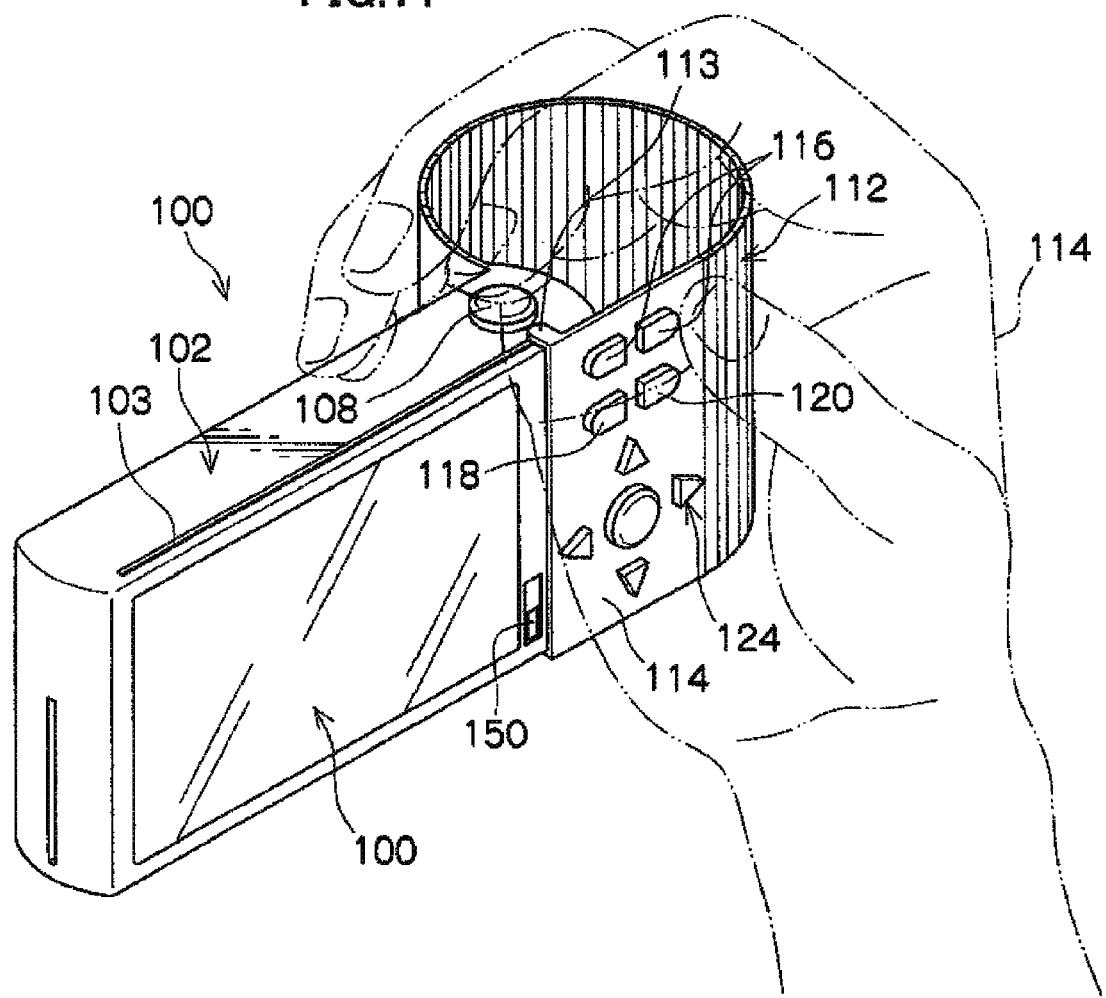
FIG. 11 is a perspective view of the digital camera with its cover serving as a grip.

On the front side of the body housing 102, a taking lens (not shown) that has a lens barrier 104 is positioned as shown in FIG. 8 and a strobe emitting portion 106 with a xenon lamp is positioned at the right upper corner. On the upper surface of the body housing 102, a shutter button 108 is positioned. The shutter button 108 is pressed halfway or fully with the forefinger of the user's right hand 114 that holds a cover (cover member) 112, which forms a grip as shown in FIG. 11. When the shutter button is halfway pressed, focus is adjusted, and when it is then fully pressed, an image of the object is formed on image-pickup elements through the taking lens. The cover 112 will be described below.

On the back side of the body housing 102, a liquid crystal monitor (display unit) 110 having an aspect ratio of 9:16 is provided as shown in FIG. 10. The liquid crystal monitor 110 has a screen size as large as possible that can be used on the body housing 102.

The body housing 102 has the cover 112 that is formed as a strip that can cover the entire area of the liquid crystal monitor 110 as shown in FIG. 9. The cover 112 is made of a deformable material such as flexible plastic or rubber and can be deformed into the first shape for covering the liquid crystal monitor 110 (see FIG. 9) and the second shape for exposing the liquid crystal monitor 110 and taking a shape of an arc at one side of the body housing 102 to form a grip (see FIGS. 10 and 11).

The strip-shaped cover 112 is integrally formed with the body housing 102 made of plastic and is connected to it at the right of the front side of the body housing 102 shown in FIG. 10. At the top and bottom of the left edge of the cover 112, locking portions 113 (the lower locking portion not shown) are formed, and they fit in rails 103 that are formed at the top and bottom surfaces of the body housing 102 (the lower rail not shown). When the locking portions 113 on the cover 112 are slid from the initial position of FIG. 9 to the right in this state, the display surface of the liquid crystal monitor 110 becomes exposed. When the locking portions 113 stop at the end of the rails 103 shown in FIG. 10 by friction, the cover 112 is maintained in the second shape.

On the right flat surface 114 of the cover 112, there are positioned operation buttons that are manipulated when the user takes pictures with the digital camera 110. The operation buttons are provided at positions that can be operated with the thumb of the user's right hand 44 that holds the cover 112 which is shaped as a grip as shown in FIG. 11.

The operation buttons include a zoom button 116, a play button 118, a photo mode button 120, a menu/OK button 112, and a cross button 124.

The zoom button 116 is operated when adjusting the focal length between telephoto side and wide-angle side. The play button 118 is operated when the user wants to reproduce taken images. The photo mode button 120 is for switching shooting between color and monochrome. The menu/OK button 122 is an operation key that serves as a menu button for instructing display of a menu on the screen of the liquid crystal monitor 110 and also as an OK button for indicating confirmation and execution of what is selected in the menu. The cross key 124 can be tilted in four directions, i.e., up, down, left and right, and is used as an operation key for selecting various configuration items when setting menus and/or instructing change of settings and deletion of recorded images.

Figure 12:
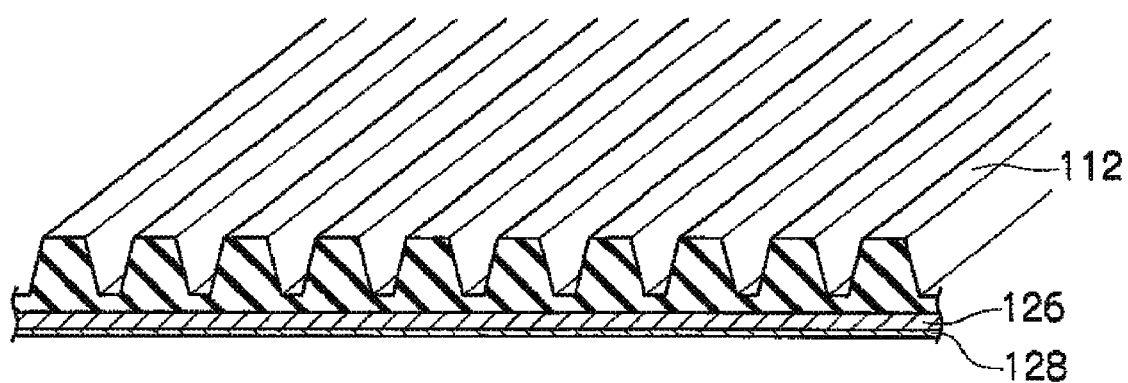
FIG. 12 is a cross-sectional view of the cover of the digital camera shown in FIG. 9.

These operation buttons 116 to 124 are implemented on a flexible printed circuit board 126 that is adhered to the back side of the cover 112 as shown in FIG. 12. The connector of the flexible printed circuit board 126 is connected to a CPU 130 of FIG. 13 that is contained in the body housing 102. A seal 128 for concealing is adhered on the flexible printed circuit board 126 so that the flexible printed circuit board 126 cannot be seen externally.

Figure 13:
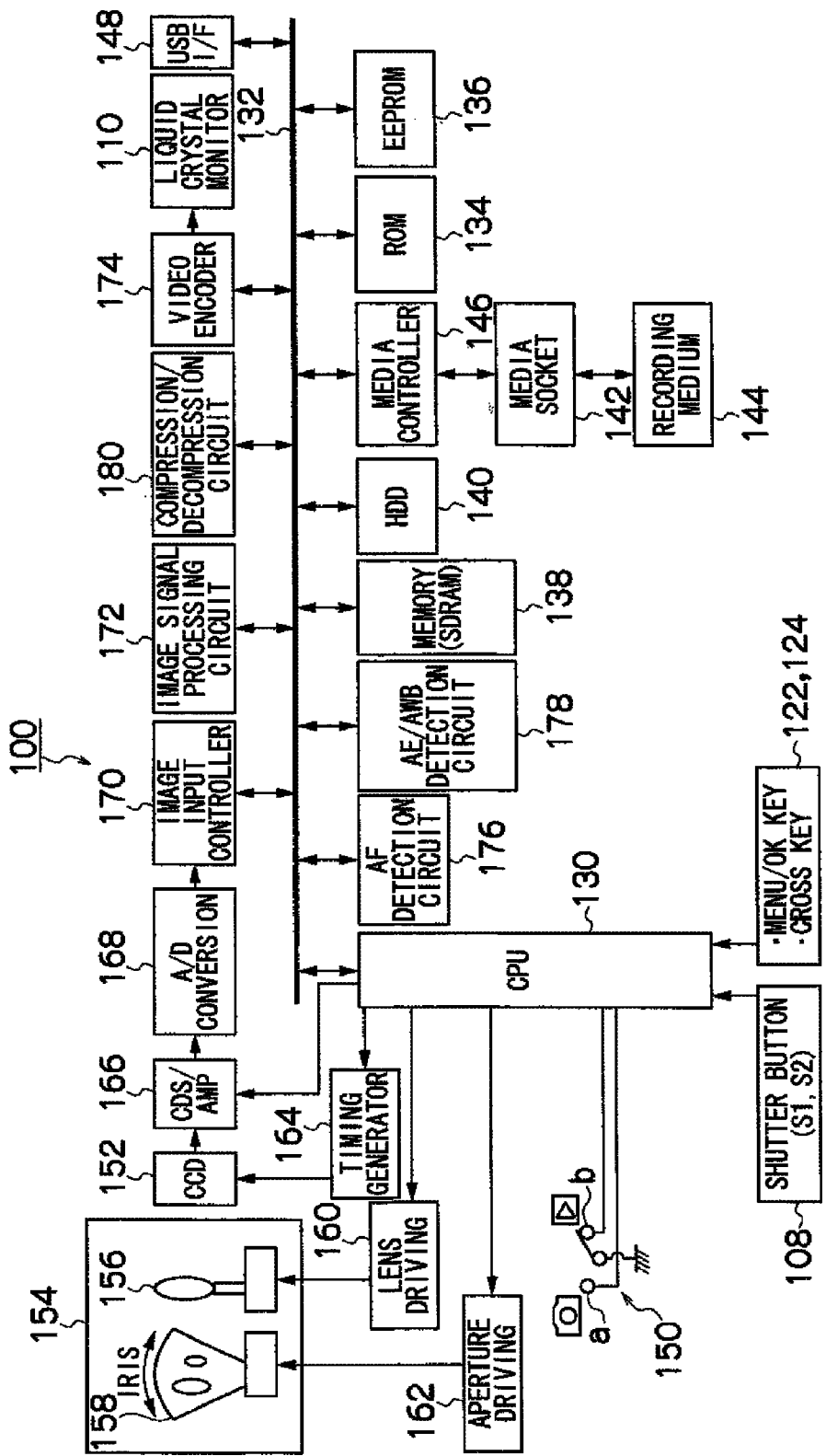
FIG. 13 is a block diagram showing the overall configuration of the digital camera shown in FIG. 8.

The central processing unit (CPU) 130 integrally controls the entire operation of the digital camera 100 as shown in FIG. 13. The CPU 130 functions both as a system control circuit section which controls the camera system according to a predetermined program, and as a computation device which executes various computations including automatic exposure (AE) computation, automatic focus adjustment (AF) computation, white balance (WB) adjustment computation and the like.

Programs executed by the CPU 130 and various data or the like necessary for control are stored in a ROM 134 connected to the CPU 130 via a bus 132. An EEPROM 136 stores CCD pixel defect information and various constants/information and the like regarding camera operation.

In addition, a memory (SDRAM) 138 is used both as a deployment area for programs and a computation work area of the CPU 130, and as a temporary storage area for image data and audio data. A storage section (HDD) 140 is a temporary storage memory used exclusively for storing image data, and is erasable through operations of the cross key 124 of the digital camera 100.

The shutter button 108 is an operation button for inputting instructions to commence photographing, and is configured as a two-stage stroke switch having a S1 switch which is activated upon half-pressing, and a S2 switch which is activated upon full-pressing.

The liquid crystal monitor 110 is also used as user interface display screens for displaying, as needed, menu information and information such as selection items, setting contents or the like. In addition, image data stored in the recording unit 140 is reduced to thumbnails to be displayed on the liquid crystal monitor 110. In the present embodiment, the liquid crystal monitor 110 is a liquid crystal display, but other display devices such an organic EL are applicable for the liquid crystal monitor 110.

The digital camera 100 is equipped with a media socket 142 to which a recording medium 144 is mounted. The format of the recording medium 144 is not particularly limited, and various media may be used, including semiconductor memory cards as typified by a SmartMedia (trademark), a portable compact hard disk, a magnetic disk, an optical disk, a magneto-optic disk, and the like.

A media controller 146 performs required signal conversion in order to deliver and receive input/output signals suitable for the recording medium 144 mounted on the media socket 142.

In addition, the digital camera 100 comprises a USB interface section 148 as a communication device to provide connection to a personal computer and other external devices. Data such as image data may be received from and delivered to an external device by connecting the external device to a connector, which is a communication terminal, connected to the USB interface section 148 via a USB cable, not shown. It is obvious that communication systems are not limited to USB, and other communication systems may be applied.

Next, the photographing function of the digital camera 100 will be described.

When the camera mode at A terminal is selected with a mode selection switch 150, power is supplied to the image capturing section including the color CCD solid-state image pickup device (hereinafter referred to as CCD) so that it enables the digital camera 100 to capture an image. In the embodiment, the mode selection switch 150 is provided on the back side of the body housing 12 where the right side of the liquid crystal monitor 110 as shown in FIGS. 10 and 11, and it can be operated only when the cover 112 is in the state of the second shape. The arrangement of the mode selection switch 150 is not limited to the above. It can be arranged on the cover 112. Moreover, the video more at B terminal is selected with the mode selection switch 150, CPU 130 reads out the images stored in the storage section (HDD) 140 or a recording medium 144 to display on the liquid crystal monitor 110.

Also, a leaf switch, which is similar to the leaf switch 40 shown in FIG. 3, turns ON the main power of the digital camera 100 according to the deformation of the cover 112 into the second shape, and it turns OFF according to the deformation of the cover 112 into the first shape.

A lens barrel 154 in FIG. 13 is an optical unit which includes the photographic lens group 156 and a diaphragm/mechanical shutter 158. The lens barrel 154 is electrically driven by a lens driving unit 160 and an aperture driving unit 162 which are controlled by the CPU 130, and performs zoom control, focus control and iris control.

Light passing through the photographic lens group 156 focuses on an acceptance surface of the CCD 152. A large number of photodiodes (light receiving elements) are two-dimensionally arranged on the acceptance surface of the CCD 152, and red (R), green (G) and blue (B) primary color filters which respectively correspond to each photodiode are positioned in a predetermined array structure. In addition, the CCD 152 is equipped with an electronic shutter function which controls a charge accumulation time (shutter speed) of each photodiode. The CPU 130 controls the charge accumulation times at the CCD 152 through a timing generator 164. Image capturing elements of other systems such as a MOS-type image capturing element may be used instead of the CCD 152.

A subject image formed on the acceptance surface of the CCD 152 is converted by each photodiode into signal charges of a quantity corresponding to the amount of incident light. Signal charges accumulated in each photodiode are sequentially read out as voltage signals (image signals) corresponding to signal charges, based on a drive pulse applied by the timing generator 164 according to instructions from the CPU 130.

Signals outputted from the CCD 152 are sent to an analog processing unit (CDS/AMP) 166, where R, G, and B signals of each pixel receive sampling hold operations (correlated double sampling processing). The signals are then amplified and applied to an A/D converter 168. The dot-sequential R, G, and B signals converted into digital signals by the A/D converter 168 are stored in the memory 138 via an image input controller 170.

An image signal processing circuit 172 processes the R, G, and B signals stored in the memory 138 according to instructions from the CPU 130. More specifically, the image signal processing circuit 172 functions as an image processing device comprising a synchronization circuit (a processing circuit which interpolates spatial discrepancies in color signals due to the color filter array of a single plate CCD to convert color signals into synchronous signals), a white balance correction circuit, a gamma correction circuit, a contour correction circuit, a luminance/color difference signal generation circuit and the like, and performs predetermined signal processing according to commands from the CPU 130 while utilizing the memory 138.

The image signal processing circuit 172 converts RGB image data inputted thereto into luminance signals and color difference signals, and also performs predetermined processing such as gamma correction. Image data processed by the image signal processing circuit 172 is stored in the recording unit (HDD) 140.

When outputting photographed play-back images onto the monitor 110, image data is read out from the recording unit 140, and is sent to a video encoder 174 via the bus 132. The video encoder 174 converts the inputted image data into signals of a predetermined system for display (such as a NTSC system color complex picture signal) and outputs the same to the monitor 110.

When the shutter button 108 is half-pressed and S1 is switched on, the digital camera 100 commences AE and AF processing. More specifically, image signals outputted from the CCD 152 are A/D converted, and inputted into an AF detection circuit 176 and an AE/AWB detection circuit 178 via the image input controller 178.

The AE/AWB detection circuit 178 includes a circuit which splits a single screen into a plurality of areas (for instance, 16 by 16) and respectively integrates RGB signals for each split area, and provides the integrated values to the CPU 130. The CPU 130 detects brightness of the subject (subject luminance) based on the integrated values inputted from the AE/AWB detection circuit 178, and calculates an exposure value (photographing EV value) suitable for photographing. An aperture value and a shutter speed are determined according to the obtained exposure value and a predetermined program diagram. According to the determined aperture value and shutter speed, the CPU 130 controls an electronic shutter and an iris of the CCD 152 to obtain an appropriate exposure.

Additionally, during automatic white balance adjustment, the AE/AWB detection circuit 178 respectively calculates an average integrated value for each color of RGB signals for each split area, and provides the calculation results to the CPU 130. Once an R integrated value, a B integrated value, and a G integrated value are obtained, the CPU 130 calculates R/G and B/G ratios for each split area, performs discrimination of light source type based on distribution of the R/G and B/G values across R/G and B/G color spaces and the like, controls gain values (white balance correction values) of the white balance adjustment circuit against the R, G, and B signals based on white balance adjustment values appropriate for the discriminated light source types so that the value of each ratio is, for instance, approximately 1, and corrects signals of the respective color channels. Images which retain a certain color may be generated by adjusting the gain values of the white balance adjustment circuit so that the above-mentioned ratios assume values other than 1.

A contrast AF which moves a focusing lens (among the lens optical system comprising the photographic lens group 156, a movable lens which contributes to focus adjustment) so that, for instance, a high frequency component of the G signal of the picture signal is maximum), is used as the AF control in the digital camera 100. More specifically, the AF detection circuit 176 is comprised of a bypass filter which allows passage of only high frequency components of the G signal, an absolute valuation processing section, an AF area extraction section which cuts out signals within a focus object area which is preset in the screen (for instance, at a central portion of a screen), and an integration section which integrates absolute value data within the AF area.

Data of integrated values obtained by the AF detection circuit 176 is notified to the CPU 130. The CPU 130 computes focus evaluated values (AF evaluated values) at a plurality of AF detection points while moving the focusing lens by controlling the lens driving section 160, and determines a lens position at which the evaluated value is maximum as a focal point. The CPU 130 then controls the lens driving section 160 so as to move the focusing lens to the obtained focal position. Calculation of AF evaluated values is not limited to a mode in which G signals are used, and luminance signals (Y signals) may be used instead.

The shutter button 108 is half-pressed to turn on S1 to perform AE/AF processing, and the shutter button 108 is full-pressed to turn on S2 to initiate photographing operations for recording. Image data obtained in response to the activation of S2 is converted into a luminance/color difference signal (Y/C signal) at the image signal processing circuit 172, and is stored in the memory 138 after receiving predetermined processing such as gamma correction and the like.

Y/C signals stored in the memory 138 are compressed according to a predetermined format at a compression/expansion circuit 180, and stored in the recording medium 144 via the media controller 146. For instance, still images are stored in JPEG format.

Next, when the replay mode at B terminal is selected with the mode selection switch 150, compressed data of the last image file (the file last recorded) stored in the recording unit 140 or the recording medium 144 is read out. If the last recorded file is a still image file, the read-out image compressed data is expanded into a non-compressed YC signal via the compression/expansion circuit 180, converted into a display signal via the image signal processing circuit 172 and the video encoder 174, and then outputted to the monitor 110. Image contents of the file are hereby displayed on the screen of the monitor 110.

During frame-by-frame playback of still images (as well as during playback of lead frames of moving images), a playback object image may be switched to a next image file (frame advance/frame reverse) by operating the right key or the left key of the cross key 124. An image file of a frame-advanced position is read out from the recording medium 144, and a still image or a moving image is playback-displayed on the monitor 110 in the same manner as described above.

In the following, the usage of the digital camera 100 having the above mentioned configuration will be described.

When the user takes pictures of an object with the digital camera 100, the user deforms the cover 112 from the first shape shown in FIG. 9 to the second shape shown in FIG. 10. This turns on a leaf switch, which is similar to the leaf switch 40 shown in FIG. 3, to power up the digital camera 100. Then, the user selects camera mode at A terminal with a mode selection switch 150, electrically opens the lens barrier 104, and holds the cover 112, which serves as a grip, with the user's right hand 44 as indicated with two-dot chained line in FIG. 11 to operate the shutter button 108 to release the shutter. Consequently, an image of the object is taken and image data for the object is selected and recorded in a recording unit (i.e., HDD) 140 or a recording medium 144.

When viewing taken images, the user selects replay mode at B terminal with the mode selection switch 150, electrically closes the lens barrier 104, and holds the cover 112, which serves as a grip, with the user's right hand 44 as illustrated by two-dot chained line in FIG. 11. The user then operates the play button 118 and/or the cross key 124 as appropriate to selectively read an image recorded in the recording unit (HDD) 140 or the recording medium 144 and display it on the liquid crystal monitor 110. The user thus can view images on the liquid crystal monitor 110 of the digital camera 100.

When the user carries the digital camera 100, the user deforms the cover 112 from the second shape shown in FIGS. 10 and 11 to the first shape shown in FIGS. 8 and 9. This turns off the leaf switch, which is similar to the leaf switch 40 shown in FIG. 3, which in turn shuts off power supply to the digital camera 100. If the lens barrier 104 is opened at this time, the lens barrier 104 is electrically closed. The user carries the digital camera 100 in this state.

Accordingly, the digital camera 100 thus configured provides the deformable cover 112 on the body housing 102 and the user deforms the cover 112 into the first shape for covering the entire area of the liquid crystal monitor 110 when carrying the camera 100 and into the second shape for forming a grip when using the camera 100. The entire area of the liquid crystal monitor 100 can thus be protected with the cover 112 on the digital camera 100 that has the liquid crystal monitor 110 with a large screen. Since the grip does not exist when the camera is carried, the body housing 102 can be made compact when the camera 100 is carried. In addition, since the cover 112 serves as a grip when the user takes pictures and views images, ease of gripping of the compact body housing 102 is improved when the user operates the camera 100.

In the digital camera 100, the CPU 130 automatically turns on the liquid crystal monitor 110 when it is detected that the cover 112 is in the second shape through turning on of the leaf switch, and the CPU 130 automatically turns off the liquid crystal monitor 110 when it is detected that the cover 112 is in the first shape through turning off of the leaf switch. Accordingly, the liquid crystal monitor 110 can be switched between on and off states according to the shape of the cover 112 in response to an action of changing the shape of the cover 112.

Furthermore, the digital camera 100 is automatically powered up when it is detected that the cover 112 is in the second shape through turning on of the leaf switch and is automatically powered down when it is detected that the cover 112 is in the first shape through turning off of the leaf switch. This can automatically switch the digital camera 100 on and off in response to an action of changing the shape of the cover 112.

In addition, since the digital camera 100 has the operation buttons 116 to 120 and various keys 122 and 124 for operating the liquid crystal monitor 110 and the like on the cover 112, when the cover 112 is deformed to the second shape for forming a grip, the operation buttons 116 to 120 and various keys 122 and 124 can be easily operated with the user's right hand 44 which holds the cover 112. This dramatically enhances the operability of the operation buttons 116 to 120 and keys 122 and 124.

Figure 14:
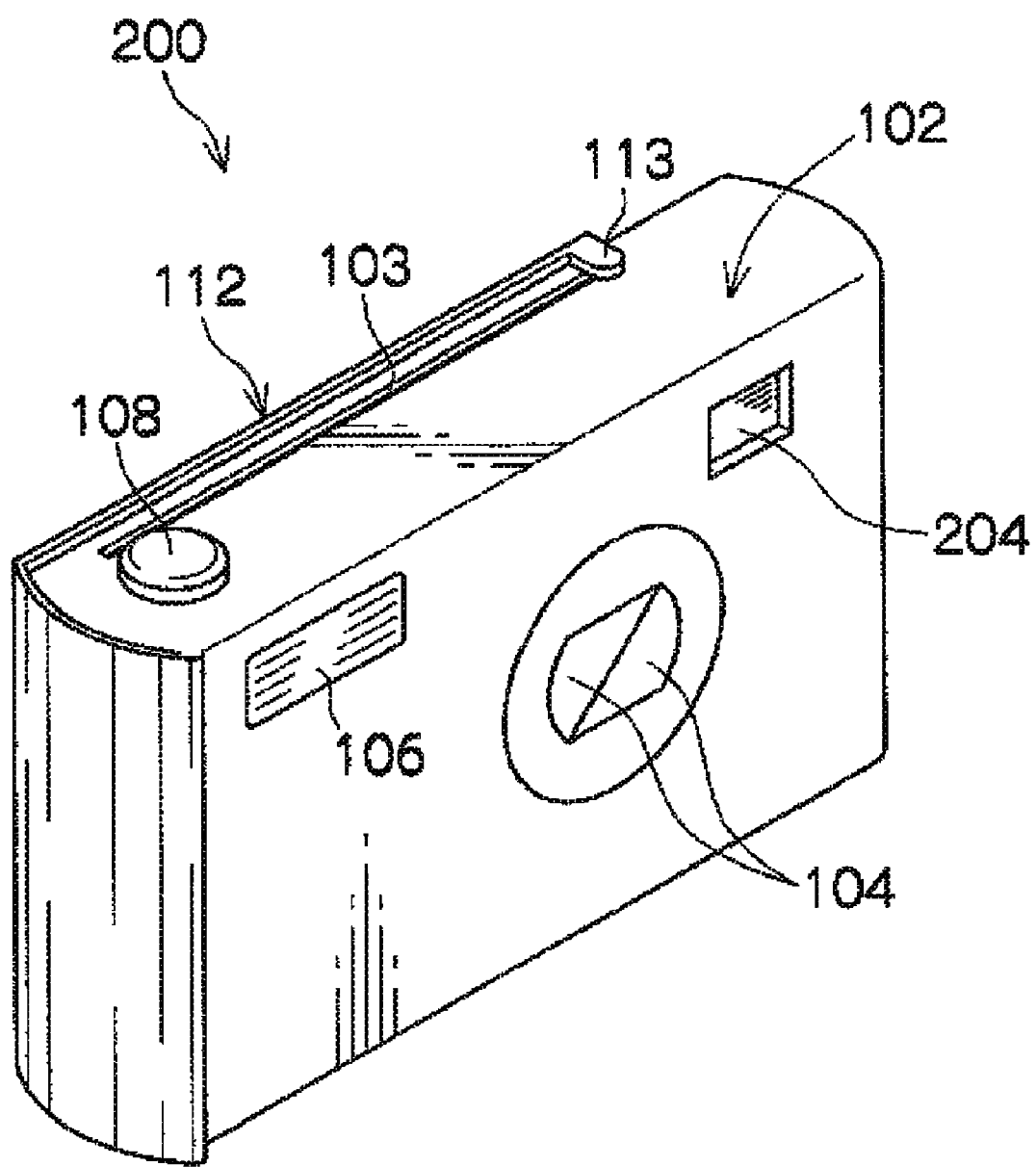
FIG. 14 is a front perspective view of the digital camera of another embodiment when it is used for taking pictures, reproducing images, and when it is carried.
Figure 15:
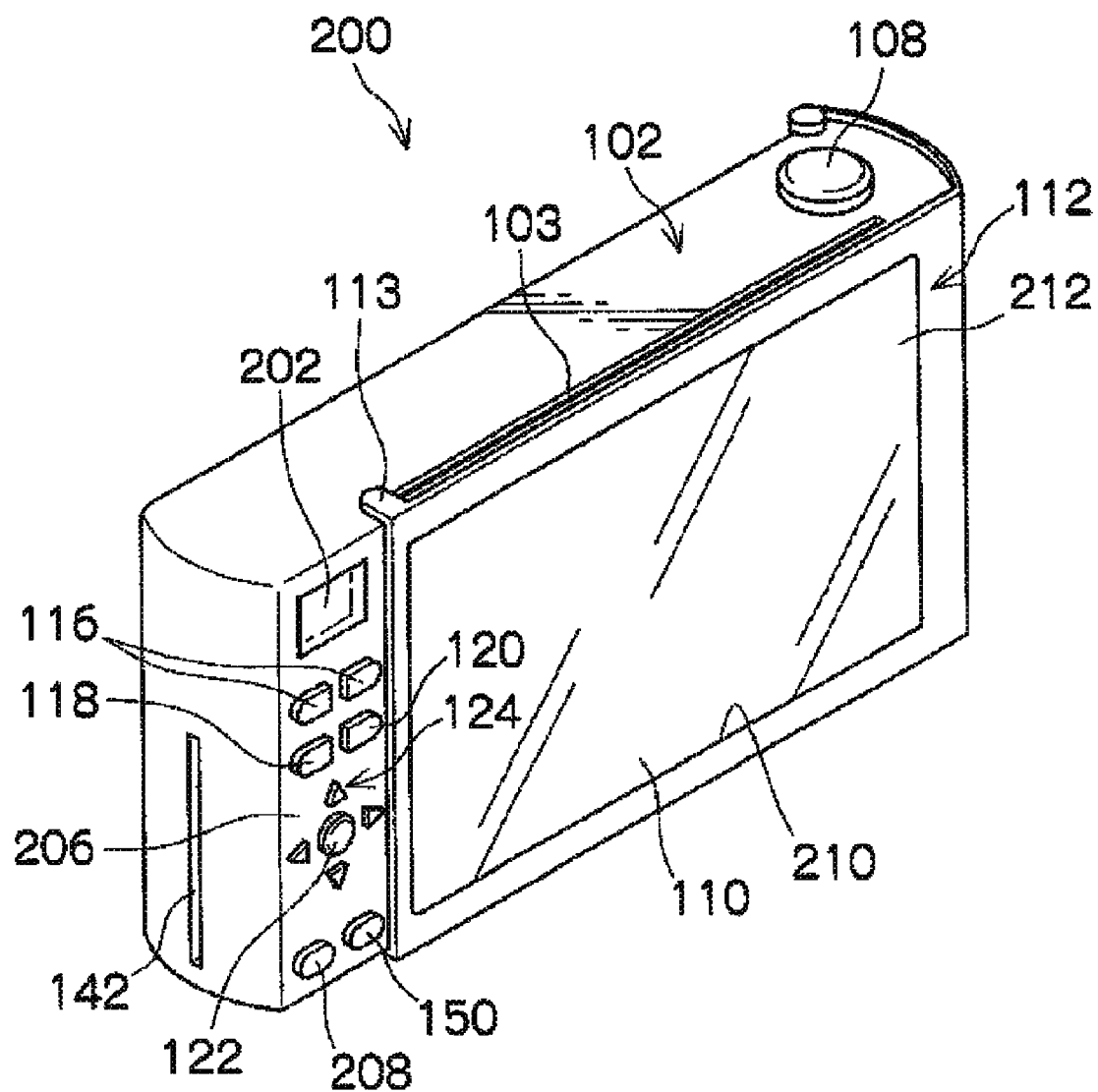
FIG. 15 is a rear perspective view of the digital camera shown in FIG. 14.

FIGS. 14 to 16 illustrate a digital camera 200 of another embodiment, where components that are the same or similar to those of the digital camera 100 shown in FIGS. 8 to 13 are designated with the same reference numerals and description on them is omitted.

FIG. 14 shows a front perspective view of the digital camera 200 as when it is used for taking pictures, reproducing images and being carried, and FIG. 15 is a rear perspective view of the digital camera 200 shown in FIG. 14. FIG. 16 is a rear perspective view of the digital camera 200 when used for taking pictures and reproducing images.

The digital camera 200 has an eyepiece 202 of an optical finder 201 on the back side of the body housing 102 shown in FIG. 16 and has an objective window 204 of the optical finder 201 on the front side of the body housing 102 at a position corresponding to the eyepiece 202.

The eyepiece 202 is provided on the upper portion of a flat surface 206 that is formed on the back side of the body housing 102 on the left of the liquid crystal monitor 110. The operation buttons 116 through 120 and various keys 122 and 124 are positioned on the flat surface 206 and a power switch 208 and the mode selection switch 150 are positioned below the key 124.

The cover 112 for covering the liquid crystal monitor 110 has a cutout in a portion that corresponds to the liquid crystal monitor 110 and a transparent view angle limiting film 212 is attached on a rectangle opening 210 that is formed by the cutout. Consequently, the liquid crystal monitor 110 can be visually seen through the view angle limiting film 212 even in the first shape in which the liquid crystal monitor 110 is covered by the cover 112. The digital camera 200 does not include a leaf switch similar to the leaf switch 40 shown in FIG. 3 and is powered up/down with the power switch 208.

The usage of the digital camera 200 having such a configuration will be described below.

When the user takes a picture of an object with the digital camera 200, the user first powers up the camera 200 with the power switch 208 and then selects shooting mode with the mode selection switch 150. The user may operate the shutter button 108 to release the shutter with the cover 112 deformed into the second shape as shown in FIG. 16 or in the first shape as shown in FIG. 15. This is because the digital camera 200 itself is already powered on and the user can take a picture of the object by using the optical finder 201 without problems. Image data for the picture of the object is recorded in a recording unit contained in the digital camera 200 or a recording medium.

When the user views a recorded image, the user selects reproduction mode with the mode selection switch 150 and then operates the play button 118 and the cross key 124 as appropriate to read out an image recorded in the recording unit or the recording medium and display it on the liquid crystal monitor 110. The user can then view the image on the liquid crystal monitor 110 of the digital camera 200. Here, the user may view the image with the cover 112 deformed into the second shape as shown in FIG. 16 or in the first shape as shown in FIG. 15. In the shape shown in FIG. 15, an image displayed on the liquid crystal monitor 110 can be viewed through the view angle limiting film 212.

When the user carries the digital camera 200, the user deforms the cover 112 into the first shape shown in FIGS. 14 and 15. The user carries the digital camera 200 in this state.

Thus, since the digital camera 200 having such a configuration has the optical finder 201 at a position on the body housing 102 that is not covered by the cover 112 and also has a separate power switch, the user can take pictures irrespective of into which shape the cover 112 is deformed.

Although the embodiments described above illustrated a case where the cover 16 and 112 are completely opened, it is also possible that the cover 16 and 112 are stopped at an intermediate position with a clicking mechanism not shown so as to expose a screen of an aspect ratio of 3:4, on which images may be displayed. It is also possible to provide a position detection device which detects this position and controls a controller for the display screen in accordance with position detection output so as to automatically control the aspect ratio of the display screen and/or display position (e.g., aligned to the left).

What is claimed is:

1. A display device comprising:
   a main body which has a surface;
   a display unit which has a display surface in the surface of the main body;
   a cover member which is provided on the main body, and is deformable into a first shape for covering the display surface in a plain plate shape and a second shape for exposing the display surface; and
   an operation button which is arranged on the cover member.

2. The display device according to claim 1, wherein the operation button is arranged in a part of the cover member, the part overlying the display surface when the cover member is in the first shape.

3. The display device according to claim 1, wherein the operation button is arranged at a position where the operation button is operable by a user's hand when the cover member is in the second shape.

4. The display device according to claim 1, wherein:
   the cover member serves as a grip when the cover member is in the second shape; and
   the operation button is arranged at a position where the operation button is operable by a user's hand holding the cover member when the cover member is in the second shape.

5. The display device according to claim 1, wherein the operation button includes an operation key.

6. A display device comprising:
   a main body which has a surface;
   a display unit which has a display surface in the surface of the main body; and
   a cover member which is provided on the main body, and is deformable into a first shape for covering the display surface in a plain plate shape and a second shape for exposing the display surface,
   wherein the cover member includes a circuit board.

7. The display device according to claim 6, wherein:
   the cover member has a back side facing the display surface when the cover member is in the first shape; and
   the circuit board is arranged on the back side of the cover member.

8. The display device according to claim 7, further comprising a seal which conceals the circuit board.

9. The display device according to claim 6, wherein the circuit board is flexible.

10. The display device according to claim 6, wherein the circuit board is connected to a central processing unit contained in the main body.

11. The display device according to claim 6, further comprising an operation button on the circuit board.

12. The display device according to claim 11, wherein the operation button is arranged in a part of the cover member, the part overlying the display surface when the cover member is in the first shape.

13. The display device according to claim 11, wherein the operation button is arranged at a position where the operation button is operable by a user's hand when the cover member is in the second shape.

14. The display device according to claim 11, wherein:
   the cover member serves as a grip when the cover member is in the second shape; and
   the operation button is arranged at a position where the operation button is operable by a user's hand holding the cover member when the cover member is in the second shape.

15. The display device according to claim 11, wherein the operation button includes an operation key.

* * * * *